US012787150B2

(12) United States Patent
Teneze

(10) Patent No.: US 12,787,150 B2
(45) Date of Patent: Nov. 3, 2026

(54) ELECTRONIC BOARD EQUIPPED WITH A HEAT DISSIPATION DEVICE AND APPARATUS COMPRISING SUCH AN ELECTRONIC BOARD

(71) Applicant: BULL SAS, Les Clayes-sous-bois (FR)

(72) Inventor: Bernard Teneze, La Roque-d'Anthéron (FR)

(73) Assignee: BULL SAS, Les Clayes-sous-Bois (FR)

( * ) Notice: Subject to any disclaimer, the term of this patent is extended or adjusted under 35 U.S.C. 154(b) by 252 days.

(21) Appl. No.: 18/748,849

(22) Filed: Jun. 20, 2024

(65) Prior Publication Data

US 2024/0431017 A1 Dec. 26, 2024

(30) Foreign Application Priority Data

Jun. 21, 2023 (EP) .................................... 23305979

(51) Int. Cl.

| | |
|---|---|
| ***H05K 1/00*** | (2006.01) |
| ***H05K 1/02*** | (2006.01) |
| ***H05K 9/00*** | (2006.01) |
| ***H10W 40/60*** | (2026.01) |
| *H10W 40/20* | (2026.01) |

(52) U.S. Cl.

CPC ......... *H05K 1/0203* (2013.01); *H05K 9/0026* (2013.01); *H05K 9/0084* (2013.01); *H10W 40/611* (2026.01); *H10W 40/231* (2026.01)

(58) Field of Classification Search

CPC .. H05K 1/0203; H05K 9/0026; H05K 9/0084; H05K 9/0032; H10W 40/611; H10W 40/231

USPC .......................................................... 361/704

See application file for complete search history.

(56) References Cited

U.S. PATENT DOCUMENTS 4,621,304 A * 11/1986 Oogaki .............. H05K 7/20436 257/E23.09

6,195,267 B1 * 2/2001 MacDonald, Jr. .... H10W 40/70 361/752

(Continued)

FOREIGN PATENT DOCUMENTS

| | | | |
|---|---|---|---|
| EP | 0130279 | A2 | 1/1985 |
| JP | 2018046176 | A | 3/2018 |

OTHER PUBLICATIONS

European Search Report and Written Opinion issued in EP23305979.9 on Nov. 24, 2023.

*Primary Examiner* — Zhengfu J Feng

(74) *Attorney, Agent, or Firm* — ARC IP Law, PC; Joseph J. Mayo

(57) ABSTRACT

The invention relates to an electronic board that includes a support, at least one electronic component mounted on the support, a protective layer mounted on said support and covering the at least one electronic component at a non-zero distance from said electronic component, and a heat dissipation device for the at least one electronic component. The heat dissipation device including a metal thermal connecting part screwed into the protective layer, passing through the protective layer and coming into contact with the at least one electronic component, so as to create a thermal connection between the at least one electronic component and the protective layer. The invention also relates to an electronic apparatus that includes the electronic board.

11 Claims, 2 Drawing Sheets

(56) References Cited

U.S. PATENT DOCUMENTS

| | | | | |
|---|---|---|---|---|
| 2004/0014508 | A1* | 1/2004 | Seo | H05K 1/0203 455/562.1 |
| 2007/0273602 | A1* | 11/2007 | Zhu | H01Q 1/526 343/702 |
| 2009/0207578 | A1* | 8/2009 | Ligtenberg | G06F 1/203 361/818 |

* cited by examiner

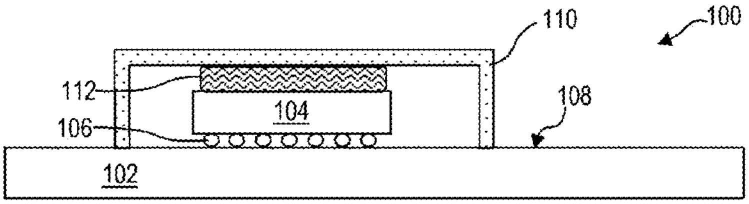
FIG. 1a: Prior Art
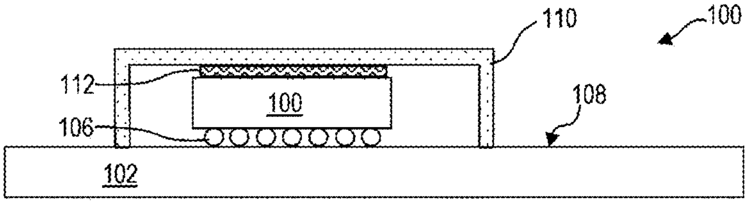
FIG. 1b: Prior Art
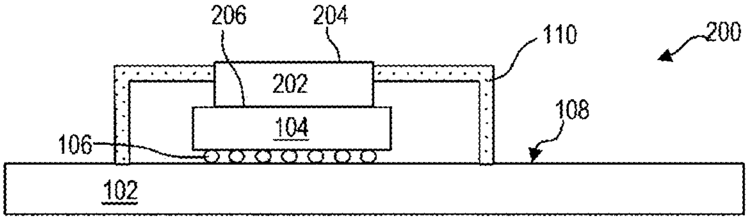
FIG. 2a
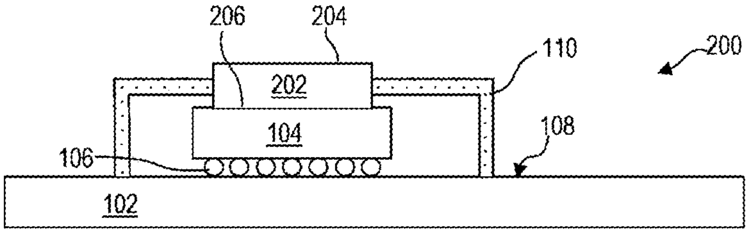
FIG. 2b

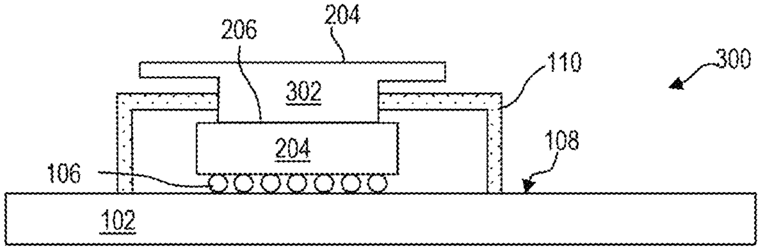
FIG. 3
FIG. 4a
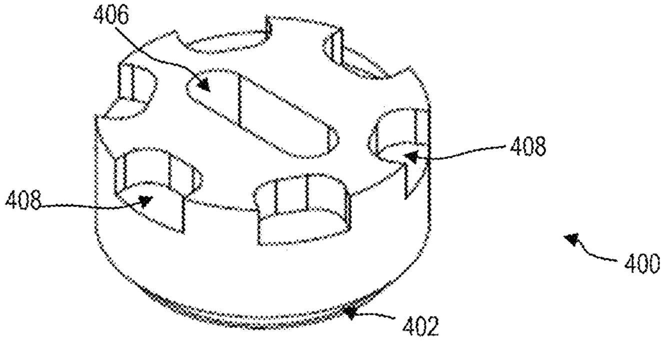
FIG. 4b
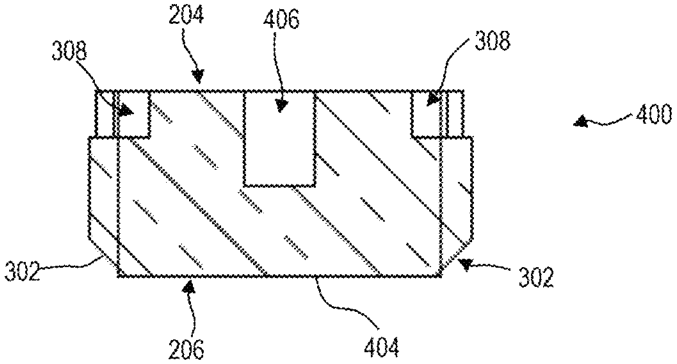

ELECTRONIC BOARD EQUIPPED WITH A HEAT DISSIPATION DEVICE AND APPARATUS COMPRISING SUCH AN ELECTRONIC BOARD

BACKGROUND OF THE INVENTION

Field of the Invention

At least one embodiment of the invention relates to an electronic board equipped with a heat dissipation device for at least one electronic component of said electronic board. It also relates to an apparatus comprising such an electronic board.

The field of the invention is generally the field of heat dissipation of components mounted on a printed circuit board, and in particular of electronic components soldered to a printed circuit board used in radiofrequency applications.

Description of the Related Art

During operation, an electronic component mounted on a printed circuit board, for example by soldering, dissipates energy in the form of heat. This heat must be dissipated so that the component never reaches the temperature beyond which it ceases to function. In order to evacuate the heat, it is known to use a heat dissipation plate in contact with the electronic component to dissipate this heat.

In some cases, the electronic component is shielded for radiofrequency isolation reasons. The dissipation plate is then outside the shielding, and cannot ensure thermal dissipation. In such cases, the solution generally employed is to establish a thermal connection between the component and the electromagnetic shielding. However, manufacturing tolerances concerning the height of the component mounted on the printed circuit board, the relative position of the shielding, and the heights of the component's solder joints do not allow the use of a metal part of predetermined dimensions to make this thermal connection.

To overcome these difficulties, the currently known solution is to use a thermal foam placed between the electronic component and the shielding: said foam enables all manufacturing tolerances to be absorbed, as the foam is compressible up to a certain point.

The main disadvantage of this solution is the poor thermal conduction of the foam. This particularly reduces heat dissipation from the electronic component.

One aim of at least one embodiment of the invention is to solve at least one of these shortcomings.

Another aim of at least one embodiment of the invention is to provide a more efficient heat dissipation solution for an electromagnetically shielded electronic component.

Another aim of at least one embodiment of the invention is to provide a heat dissipation solution for an electromagnetically shielded electronic component that adapts to the manufacturing tolerances while achieving more efficient heat dissipation than known solutions.

BRIEF SUMMARY OF THE INVENTION

At least one embodiment of the invention proposes to achieve at least one of the aforementioned aims with an electronic board comprising:

- a support,
- at least one electronic component mounted on said support,
- a protective layer, mounted on said support at a non-zero distance from said electronic component and covering said electronic component, and
- a heat dissipation device for said electronic component, characterized in that said heat dissipation device comprises a metal thermal connecting part screwed into said protective layer, passing through said protective layer and coming into contact with said electronic component, so as to create a thermal connecting between said electronic component and said protective layer.

Thus, at least one embodiment of the invention proposes a thermal connecting part which is made of metal. Such a metal part has better thermal conduction compared to the thermal foam used in known solutions, resulting in an improved thermal connection between the component and the protective layer, and therefore better heat dissipation.

Furthermore, at least one embodiment of the invention proposes a thermal connecting part that is screwed into the protective layer. In this way, it is possible to adjust the position of said thermal connecting part according to the height at which the electronic component is positioned once mounted on the electronic board, and thus to adapt to the height differences of said electronic component due to manufacturing tolerances of the electronic board.

At least for these reasons, at least one embodiment of the invention provides a heat dissipation solution that adapts to manufacturing tolerances while achieving more efficient heat dissipation for an electronic component covered by a protective layer, such as an electromagnetic shielding layer.

Furthermore, using a thermal connecting part screwed into the protective layer means that the protection provided by the protective layer is not disrupted, as the screwing maintains contact between the thermal transfer part and the protective layer, and therefore the protection provided, particularly when the protective layer provides electromagnetic shielding.

The electronic component can be any type of electronic component mounted on, and in particular soldered to, an electronic board. For example, the electronic component may be an electronic chip, an FPGA, a memory chip, a processor, an electrical component, a signal processing component, a power electronics component and so on.

The support on which the at least one electronic component is mounted, in particular soldered, can be any type of support, and in particular a printed circuit board, or PCB.

According to one or more embodiments, the thermal connecting part may be a screw.

According to one or more embodiments, the thermal connecting part may have a flat surface at its end that comes into contact with the electronic component.

In this way, the contact surface between the electronic component and the thermal connecting part is increased, improving the thermal dissipation of the heat generated by said electronic component.

According to one or more embodiments, the thermal connecting part may comprise, on the side opposite its end that comes into contact with the electronic component, a means for screwing and unscrewing said thermal connecting part, in particular using a tool.

Such a means of manipulation may, for example, be provided to accommodate a tool, such as a screwdriver or similar, for screwing the thermal connecting part into the protective layer.

Such a means of manipulation may be male or female.

In particular, such a means of manipulation may be a notch, or a recess, provided on the connecting part on the side of its end opposite that coming into contact with the electronic component.

According to one or more embodiments, the thermal connecting part may comprise, on the side opposite its end coming into contact with the electronic component, a means for rotationally locking said part after it has been fitted.

Such a means thus ensures that the thermal connecting part remains in position and does not unscrew over time. Thus, it is possible to ensure that the contact between the thermal connecting part and the electronic component is maintained over time, and that heat is therefore dissipated.

Such a position locking means may be male or female.

In particular, such a locking means may be, or comprise, at least one notch designed to receive an adhesive, or a varnish, deposited in said notch and extending over the protective layer, thus enabling the thermal connecting part to be rotationally locked.

For example, the at least one notch may be provided on a periphery of the connecting part, relative to the axis of rotation of said thermal connecting part According to one or more embodiments, the thermal connecting part may be made of copper, aluminum, steel, brass, titanium, bronze or any other metal material having sufficient heat conduction to dissipate heat from the electronic component.

The protective layer can be made of any material adapted to the protective function performed by said protective layer.

According to one or more embodiments, the protective layer may be made of metal.

The protective layer can provide any type of protection. For example, the protective layer can provide protection against water, dust, etc.

According to one or more embodiments, the protective layer may be an electromagnetic shielding layer. In this case, the protective layer, also known as the shielding layer, is made of metal.

According to one or more embodiments, the protective layer may be dedicated to a single electronic component of the board according to one or more embodiments of the invention.

According to one or more embodiments, the protective layer may be common to several electronic components, and in particular to all the electronic components of the circuit board.

When the protective layer is common to several electronic components, heat dissipation can be achieved for each of these electronic components.

Alternatively, when the protective layer is common to several electronic components, heat dissipation can be achieved for some, or even just one, of these electronic components.

According to one or more embodiments, the board according to at least one embodiment of the invention may comprise at least two electronic components equipped with an individual metal thermal connecting part.

In other words, each of these two electronic components is equipped with an individual thermal connecting part dedicated to said electronic component. In this way, at least one embodiment of the invention enables efficient heat dissipation dedicated to each electronic component.

According to one or more embodiments, the board according to at least one embodiment of the invention may further comprise a heat sink connected to the protective layer and/or the thermal connecting part. In this case, heat dissipation is provided by the thermal connecting part, by the protective layer and by the heat sink.

The heat sink can be common to several components, and in particular to the entire electronic board.

According to one or more embodiments, the board according to at least one embodiment of the invention may not comprise a heat sink. In this case, heat dissipation is provided by the thermal connecting part and, above all, by the protective layer.

The electronic board according to at least one embodiment of the invention may be an electronic board that can be implemented in all fields of electronics, in any electronic apparatus, and in any type of application.

According to one or more embodiments, the electronic board according to at least one embodiment of the invention may be used in a radiofrequency application or apparatus.

According to another aspect of at least one embodiment of the invention, an electronic apparatus comprising an electronic board according to one or more embodiments of the invention is proposed.

The electronic apparatus may be any type of apparatus.

In particular, the electronic apparatus may be a server, a calculator, a computer, a tablet, a telephone, a goniometer, a transmitter and in particular a radiofrequency transmitter, a receiver and in particular a radiofrequency receiver, an antenna and so on.

DESCRIPTION OF THE DRAWINGS

Other benefits and features shall become evident upon examining the detailed description of entirely non-limiting embodiments, and from the appended drawings in which:

FIGS. 1*a* and 1*b* are schematic depictions of an exemplary embodiment of a board comprising a prior art heat dissipation solution;

FIGS. 2*a* and 2*b* are schematic depictions of a non-limiting example of an electronic board according to one or more embodiments of the invention;

FIG. 3 is a schematic depiction of another non-limiting example of an electronic board according to one or more embodiments of the invention; and FIGS. 4*a* and 4*b* are schematic depictions of a thermal connecting part that can be implemented in an electronic board according to one or more embodiments of the invention.

DETAILED DESCRIPTION OF THE INVENTION

It is clearly understood that the one or more embodiments that will be described hereafter are by no means limiting. In particular, it is possible to imagine variants of the one or more embodiments of the invention that comprise only a selection of the features disclosed hereinafter in isolation from the other features disclosed, if this selection of features is sufficient to confer a technical benefit or to differentiate the one or more embodiments of the invention with respect to the prior art. This selection comprises at least one preferably functional feature which is free of structural details, or only has a portion of the structural details if this portion alone is sufficient to confer a technical benefit or to differentiate the one or more embodiments of the invention with respect to the prior art.

In particular, all of the described variants and the one or more embodiments can be combined with each other if there is no technical obstacle to this combination.

In the figures and in the remainder of the description, the same reference has been used for the features that are common to several figures.

FIGS. 1*a* and 1*b* are schematic depictions of a prior art electronic board.

The electronic board 100 shown in FIGS. 1*a* and 1*b* comprises a support 102 on which at least one electronic component 104 is mounted.

The support 102 can be any type of support capable of accommodating electronic components. In particular, the support 102 is a printed circuit board, or PCB, commonly used in electronic board design.

The component 104 can be any type of electronic component, such as for example an electronic chip, a processor, a memory chip, an FPGA, etc.

In the example shown in FIGS. 1*a* and 1*b*, and without loss of generality, only one electronic component is shown. Of course, the electronic board 100 can comprise, and generally comprises, several electronic components.

The electronic component 104 can be mounted on the support 102 in various ways. In particular, the electronic component 104 can be soldered by one or more solder joints 106 to a face 108, referred to hereinafter as the front face of the support 102.

The electronic board 100 further comprises a protective layer 110 covering the electronic component 104. In the example shown, the protective layer 110 is shown as covering a single electronic component. Of course, this is by no means limiting, and the protective layer 110 can, and usually does, cover several electronic components. In some cases, the protective layer 110 may cover all the components mounted on the support 102.

The protective layer 110 completely covers the electronic component 104. In other words, the protective layer 110 forms a protective dome, bell or else cover all around the electronic component 104. In even other words, the protective layer 110 delimits a closed protective chamber all around the electronic component 104 on the side of the front face 108 of the support 102.

The protective layer 110 can provide any type of protection: protection against water, air, dust, etc. The protective layer is made of a material suited to the function of the protective layer, for example, plastic, metal, etc.

Hereinafter, without loss of generality, the protective layer 110 provides electromagnetic shielding for the electronic component 104, and may be referred to as the shielding layer 110. The shielding layer 110 is made of metal.

When the electronic component 104 is in operation, it heats up. To prevent overheating, it is necessary to dissipate the heat generated thereby, otherwise the said component will malfunction or even deteriorate, leading to the said component 104 ceasing to operate.

However, the electronic component 104 is surrounded by a shielding layer 110. Thus, to dissipate the heat from the electronic component 104, a thermal connection must be created between the electronic component 104 and the shielding layer 110 and optionally a heat sink (not shown in FIGS. 1*a* and 1*b*). Such a thermal connection will enable heat to be conducted from the electronic component 104 to the protective layer 110 (and optionally to the heat sink), which will ensure that said heat is dissipated, for example to the ambient air.

Due to manufacturing tolerances related:

to the height of the electronic component 104, to the height of the solder joints 106, and/or to the height of the protective layer 110;

it is not possible, or extremely difficult, to achieve the thermal connection by means of a metal part inserted between the electronic component 104 and the shielding layer 110. To overcome this problem, the currently known solution uses a thermal foam 112 between the electronic component 104 and the shielding layer 110. This thermal foam 112 is compressible and can absorb manufacturing tolerances, as seen in the configuration shown in FIG. 1*b* in which it is compressed more than the configuration shown in FIG. 1*a*.

However, this solution has major disadvantages. One major disadvantage is that the thermal foam 112 has low thermal conduction, which means it cannot dissipate heat from the electronic component 104 in a satisfactory manner. On the other hand, when the protective layer 110 is non-metallic, this solution does not allow heat dissipation.

The at least one embodiment of the invention proposes to remedy at least these disadvantages.

FIGS. 2*a* and 2*b* are schematic depictions of an electronic board according to one or more embodiments of the invention.

The electronic board 200 shown in FIGS. 2*a* and 2*b* comprises all the components of the electronic board 100 of FIGS. 1*a* and 1*b*, as well as all the alternatives described for these components, with the exception of the thermal foam 112.

Unlike the board 100, the electronic board 200 comprises a thermal connecting part 202 between the electronic component 104 and the protective layer 110.

The thermal connecting part 202 is made of metal, and in particular copper, and provides good thermal conduction.

In addition, the thermal connecting part 202 is screwed into shielding layer 110. Thus, the thermal connecting part 202 has a contact surface with the shielding layer extending through the entire thickness of the shielding layer 110, enabling efficient heat transfer to said shielding layer 110.

Above all, as the thermal connecting part 202 is screwed into the shielding layer 110, this allows the position of the thermal connecting part 202 to be adjusted to the height of the electronic component 104 after this latter has been mounted on the support 102, and therefore to absorb manufacturing tolerances. Thus, in the configuration shown in FIG. 2*b*, by way of at least one embodiment, the thermal connecting part 202 is in a higher position than in the configuration shown in FIG. 2*a*.

In any case, the connecting part 202 can be screwed on sufficiently, for example at its end 204, the so-called proximal end, to come into contact with the electronic component 104, at one end 206, called the distal end, opposite the proximal end 204. Furthermore, the thermal connecting part 202 is fitted and adjusted after the electronic component 104 and the shielding layer 110 have been mounted on the support 102. This simplifies implementation compared with the current solution.

The distal end 206 coming into contact with the electronic component 104, and in particular against an upper face of the electronic component 104, may comprise a flat surface allowing the contact surface to be increased between the electronic component 104 and the thermal connecting part 202, and therefore the transfer of heat to be increased from the electronic component 104 to the connecting part 202, and therefore to the protective layer 110 and/or a heat sink (not shown) equipping the electronic board 200.

Furthermore, the thermal connecting part 202 can, if required, be directly connected to a heat sink (not shown), for example by, or at, the proximal end 204 thereof. Thus, if the protective layer (or the shielding layer) 110 does not provide heat dissipation, or sufficient heat dissipation, a heat sink can be connected to the thermal connecting part 202 directly.

Thus, by way of one or more embodiments, the proposed solution enables better heat dissipation from the electronic component 104, while adjusting to the manufacturing and assembly tolerances of the electronic component 104 and/or the protective layer 110.

The thermal connecting part 202 can take any form.

The thermal connecting part 202 may comprise a screwing means (not shown in FIGS. 2*a* and 2*b*), in one or more embodiments, such as a notch or recess, enabling it to be screwed and unscrewed, in particular using a screwdriver-type tool or the like.

The thermal connecting part 202 may comprise a position-locking means (not shown in FIGS. 2*a* and 2*b*), by way of at least one embodiment, such as a notch or a recess designed to receive an adhesive or varnish connecting it to the protective layer 110, once mounted and adjusted.

FIG. 3 is a schematic depiction of another non-limiting example of an electronic board according to one or more embodiments of the invention.

The electronic board 300 shown in FIG. 3 comprises all of the components of the board 200 shown in FIGS. 2*a* and 2*b*, with the exception of the thermal connecting part 202.

The electronic board 300 comprises a thermal connecting part 302 with all the features of the thermal connecting part 202, except on the side of the proximal end 204 thereof. In fact, the thermal connecting part 302 comprises a greater width on the side of the proximal end 204 thereof, compared with the rest of said part, and making it possible to improve heat dissipation.

Of course, the embodiments described are non-limiting examples given by way of illustration. The thermal connecting part may take other forms than those shown in FIGS. 2*a*-2*b* and FIG. 3, by way of at least one embodiment of the invention.

FIGS. 4*a* and 4*b* are schematic depictions of a non-limiting embodiment of a thermal connecting part that can be implemented in an electronic board according to one or more embodiments of the invention.

The thermal connecting part 400 of FIGS. 4*a* and 4*b* can be implemented in any electronic board according to one or more embodiments of the invention, and in particular in the electronic board 200 of FIGS. 2*a* and 2*b*, or in the electronic board 300 of FIG. 3.

The thermal connecting part 400 is shown in FIG. 4*a* in an isometric view, and in FIG. 4*b* in a cross-sectional view along the mounting (screwing/unscrewing) axis of said part.

The thermal connecting part 400 shown in FIGS. 4*a* and 4*b* may be the thermal connecting part 202 of FIGS. 2*a* and 2*b*, or the thermal connecting part 302 of FIG. 3, by way of at least one embodiment.

In the non-limiting example shown in FIGS. 4*a* and 4*b*, according to one or more embodiments, the thermal connecting part 400 takes the general form of a screw, with a generally cylindrical cross-section.

The thermal connecting part 400 comprises a threaded section 402. This threaded section 402 enables the thermal connecting part 400 to be screwed into a threaded hole provided for this purpose in the protective layer positioned above the electronic component. In the non-limiting example shown, by way of at least one embodiment, the threaded section 402 is closer to the distal end 206 of the thermal connecting part 400 intended to come into contact with the electronic component.

The thermal connecting part 400 comprises, on the side of the distal end 206 thereof, a flat surface 404 designed to come into contact with the electronic component. This flat surface 404 is preferably as wide as possible to optimize the thermal connection between the part 400 and the electronic component.

The thermal connecting part 400 comprises, on the side of the proximal end 204 thereof, a notch (or a recess) 406 designed to receive a screwdriver, or similar tool, for screwing or unscrewing said part 400 in the protective layer.

Of course, this example is by no means limiting, and other screwing/unscrewing means can be used in place of the notch 406, in one or more embodiments of the invention.

The thermal connecting part 400 comprises, on the side of the proximal end 204 thereof, one or more notches 408 used to prevent the rotation of said part 400 after fitting and adjustment. In particular, a drop of varnish, adhesive or any other hardening or sticky material is deposited in one or more notches 408 and on the protective layer. As this material hardens, it creates a mechanical bond between the thermal connecting part 400 and the protective layer, opposing the rotation of the thermal connecting part 400 which keeps said thermal connecting part 400 in position and in contact with the electronic component. Of course, the at least one embodiment is by no means limiting, and other position-locking means can be used in place of the notches 408. For example, the thermal connecting part can be soldered to the protective layer after it has been installed, in one or more embodiments.

Of course, the at least one embodiment of the invention is not limited to the examples disclosed above.

The invention claimed is:

1. An electronic board comprising:
- a support,
- at least one electronic component mounted on said support,
- a protective layer, mounted on said support at a non-zero distance from said at least one electronic component and covering said at least one electronic component, and
- a heat dissipation device for said at least one electronic component;
- wherein said heat dissipation device comprises a metal thermal connecting part screwed into said protective layer, passing through said protective layer and coming into contact with said at least one electronic component, so as to create a thermal connection between said at least one electronic component and said protective layer;
- wherein the metal thermal connecting part comprises a flat surface at a first end coming into contact with the at least one electronic component;
- wherein the metal thermal connecting part further comprises, on a second side opposite the first end thereof coming into contact with the at least one electronic component, a notch that prevents a rotation of said metal thermal connecting part after the metal thermal connecting part been fitted; and
- wherein said notch is designed to receive an adhesive, or a varnish, deposited in said notch.

2. The electronic board according to claim 1, wherein the metal thermal connecting part is a screw.

3. The electronic board according to claim 1, wherein the notch screws and unscrews said metal thermal connecting part.

4. The electronic board according to claim 1, wherein the metal thermal connecting part is made of copper, aluminum, steel, brass, titanium or bronze.

5. The electronic board according to claim 1, wherein the protective layer is metal.

6. The electronic board according to claim 1, wherein the protective layer is an electromagnetic shielding layer.

7. The electronic board according to claim 1, wherein the protective layer is common to several electronic components.

8. The electronic board according to claim 1, further comprising at least two electronic components equipped with an individual metal thermal connecting part.

9. The electronic board according to claim 1, further comprising a heat sink connected to one or more of the protective layer and the metal thermal connecting part.

10. The electronic board according to claim 1, wherein the electronic board is configured to be used in a radiofrequency application or apparatus.

11. An electronic apparatus comprising:

an electronic board that comprises a support, at least one electronic component mounted on said support, a protective layer, mounted on said support at a non-zero distance from said at least one electronic component and covering said at least one electronic component, and a heat dissipation device for said at least one electronic component;

wherein said heat dissipation device comprises a metal thermal connecting part screwed into said protective layer, passing through said protective layer and coming into contact with said at least one electronic component, so as to create a thermal connection between said at least one electronic component and said protective layer;

wherein the metal thermal connecting part comprises a flat surface at a first end coming into contact with the at least one electronic component;

wherein the metal thermal connecting part further comprises, on a second side opposite the first end thereof coming into contact with the at least one electronic component, a notch that prevents a rotation of said metal thermal connecting part after the metal thermal connecting part been fitted; and wherein said notch is designed to receive an adhesive, or a varnish, deposited in said notch.

* * * * *